United States Patent [19]
Shimazu

[11] Patent Number: 6,031,205
[45] Date of Patent: Feb. 29, 2000

[54] THERMAL TREATMENT APPARATUS WITH THERMAL PROTECTION MEMBERS INTERCEPTING THERMAL RADIATION AT OR ABOVE A PREDETERMINED ANGLE

[75] Inventor: Tomohisa Shimazu, Minato-ku, Japan

[73] Assignee: Tokyo Electron Limited, Japan

[21] Appl. No.: 08/913,240

[22] PCT Filed: Mar. 1, 1996

[86] PCT No.: PCT/JP96/00503

§ 371 Date: Sep. 10, 1997

§ 102(e) Date: Sep. 10, 1997

[87] PCT Pub. No.: WO96/28843

PCT Pub. Date: Sep. 19, 1996

[30] Foreign Application Priority Data

Mar. 13, 1995 [JP] Japan ...................................... 7-80696

[51] Int. Cl.$^7$ .......................... H01L 21/22; H01L 21/205
[52] U.S. Cl. ........................... 219/390; 118/725; 118/728
[58] Field of Search .................................. 219/390, 497, 219/494, 405, 411; 118/719, 725, 728, 50.1, 724; 432/241; 392/416, 418, 417; 250/492.2, 492.22; 373/136

[56] References Cited

U.S. PATENT DOCUMENTS 5,616,264  4/1997  Nishi et al. .............................. 219/494

FOREIGN PATENT DOCUMENTS

| 60-92826 | 6/1985 | Japan . |
| 1-93724 | 6/1989 | Japan . |
| 4-304652 | 10/1992 | Japan . |
| 7-45691 | 2/1995 | Japan . |
| 8-97167 | 4/1996 | Japan . |

*Primary Examiner*—John A. Jeffery
*Attorney, Agent, or Firm*—Smith, Gambrell & Russell

[57] ABSTRACT

In a thermal treatment apparatus that accommodates substrates to be processed (W) in multiple stages within a reaction tube (4) and subjects them to a thermal treatment, thermal protection members (19) are provided around the peripheries of the substrates (W) to be processed to intercept thermal radiation that is incident on the peripheral edge portions thereof at a predetermined angle of incidence or greater. The peripheral edge portions of substrates (W) to be processed are generally more readily affected by thermal radiation as the angle of incidence of thermal radiation thereon increases, but, since thermal radiation from the heater at a predetermined angle of incidence (θ) or greater is intercepted by the thus disposed thermal protection members (19), the effects on thermal radiation on the peripheral edge portions of the substrates (W) to be processed are controlled. As a result, the temperature difference within the surface between the central portion and peripheral edge portion of each substrate to be processed (W) can be sufficiently reduced, not only under normal pressure within the reaction tube (4) but also under reduced pressures, and thus the temperature can be raised or lowered rapidly, enabling an increase in throughput.

33 Claims, 5 Drawing Sheets

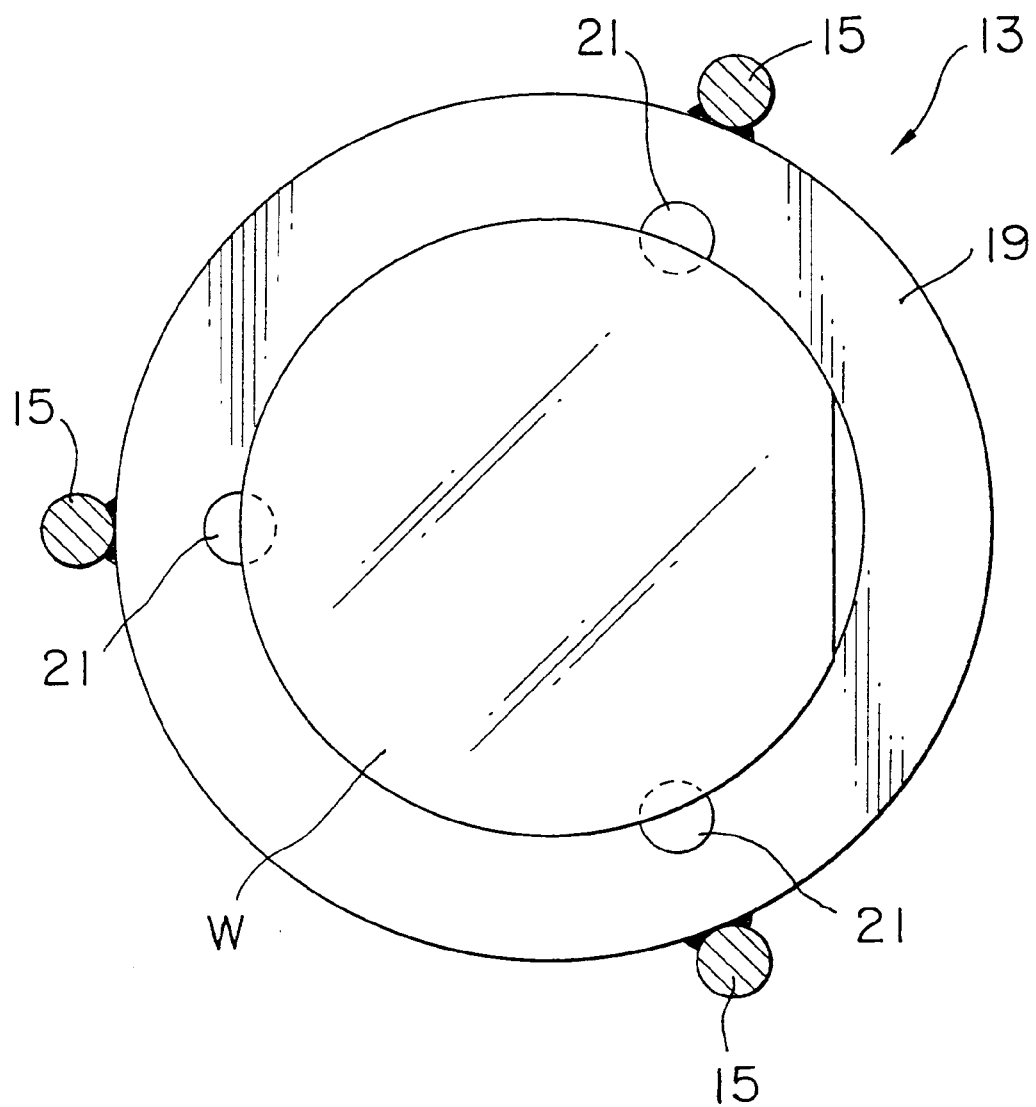
F I G. 6

THERMAL TREATMENT APPARATUS WITH THERMAL PROTECTION MEMBERS INTERCEPTING THERMAL RADIATION AT OR ABOVE A PREDETERMINED ANGLE

TECHNICAL FIELD

The present invention relates to a thermal treatment apparatus for substrates to be processed, such as semiconductor wafers.

BACKGROUND ART

Various types of thermal treatment apparatus are used in the fabrication of semiconductor devices, to perform processes such as oxidation, diffusion, chemical vapor deposition (CVD), or annealing on a semiconductor wafer that is the substrate to be processed. One of these is a vertical thermal treatment apparatus which is capable of batch-processing a large number of wafers simultaneously and which is provided with a reaction tube (process tube) that functions as a thermal treatment chamber within a type of furnace called a hot-wall furnace, which has a heater disposed around the periphery thereof. A large number of substrates to be processed are held horizontally and in multiple stages at a suitable spacing in the vertical direction by a wafer boat that is means for supporting substrates to be processed within the reaction tube, and this large number of wafers is subjected to a thermal treatment simultaneously.

In the thus configured prior-art thermal treatment apparatus, thermal radiation from the heater is more likely to be incident from more directions on the peripheral edge portions of the wafers held in the wafer boat than on the central portions thereof. A dramatic difference can easily occur in the temperature response characteristics of the central portions and peripheral edge portions of the wafers, particularly if the temperature increases or decreases rapidly, and this tends to cause slipping (crystal distortion) in the wafers, due to internal stresses generated by temperature differences within the surfaces of the wafers. To solve this problem, the wafer boat in the prior-art thermal treatment apparatus is provided with ring-shaped support plates to support the under-surfaces of peripheral edge portions of the wafers, in surface contact therewith (a wafer boat provided with such ring-shaped support plates is called a ring boat), with the objective of using the thermal capacity of these support plates to control the temperature response characteristics of the peripheral edge portions of the wafers, and thus reduce the temperature difference within the surface between the central portion and the peripheral edge portion of each wafer.

However, heat conduction between each wafer and its ring-shaped support plate in the above described prior-art thermal treatment apparatus is not by radiation alone; heat conduction through the gases present between the wafer and the support plate (heat conduction through gases, also called convective heat transfer) is also an important element. For that reason, if the temperature within the reaction tube is raised or lowered rapidly in a reduced-pressure state, the effects of the ring-shaped support plates are not fully realized and it becomes difficult to sufficiently reduce the temperature difference between the central and peripheral edge portions of each wafer. Therefore, since it is difficult to raise or lower the temperature rapidly under a reduced pressure in this prior-art thermal treatment apparatus, there is a limit to improvements in throughput.

The object of the present invention is therefore to provide a thermal treatment apparatus that is designed to improve throughput by reducing the difference in temperature within the surface between the central portion and peripheral edge portion of each wafer, not only under normal pressure within a thermal treatment chamber but also under reduced pressures, in order to solve the above problem in the prior art.

DISCLOSURE OF INVENTION

In order to achieve the above object, the present invention relates to a thermal treatment apparatus for accommodating substrates to be processed within a thermal treatment chamber and performing a thermal treatment thereon, wherein thermal protection members (buffers) are provided around the peripheries of the substrates to be processed, for intercepting thermal radiation from a heater that is incident on the peripheral edge portions thereof at a predetermined angle of incidence or greater.

In general, a factor called the radiation view factor increases as the angle of incidence of thermal radiation from the heater increases (in other words, as the surface to be processed of the substrate becomes perpendicular to the incident rays), so that the peripheral edge portion of a substrate to be processed (such as a wafer) is more readily affected by thermal radiation. However, the provision of thermal protection members around the substrate to be processed in accordance with the present invention ensures the interception of thermal radiation from the heater that is incident at a predetermined angle of incidence or greater on the peripheral edge portions of the substrates to be processed, so that the effects due to thermal radiation on that peripheral edge portions can be actively controlled. Therefore, the effects of thermal radiation on the peripheral edge portions of the substrates to be processed are controlled in the thermal treatment apparatus of this invention, not only from the viewpoint of heat conduction through gases but also from heat transfer by radiation, unlike in the thermal treatment apparatus of the prior art, thus making it possible to reduce the difference in temperature within the surface between the central portion and peripheral edge portion of each wafer, not only under normal pressure within a thermal treatment chamber but also under reduced pressures. As a result, the temperature can be raised or lowered rapidly, enabling an increase in throughput.

BRIEF DESCRIPTION OF DRAWINGS

FIG. 6 is a plan view of the loaded portions of the substrates to be processed of FIG. 5.

BEST MODES FOR CARRYING OUT THE INVENTION

Embodiment 1

Figure 1:
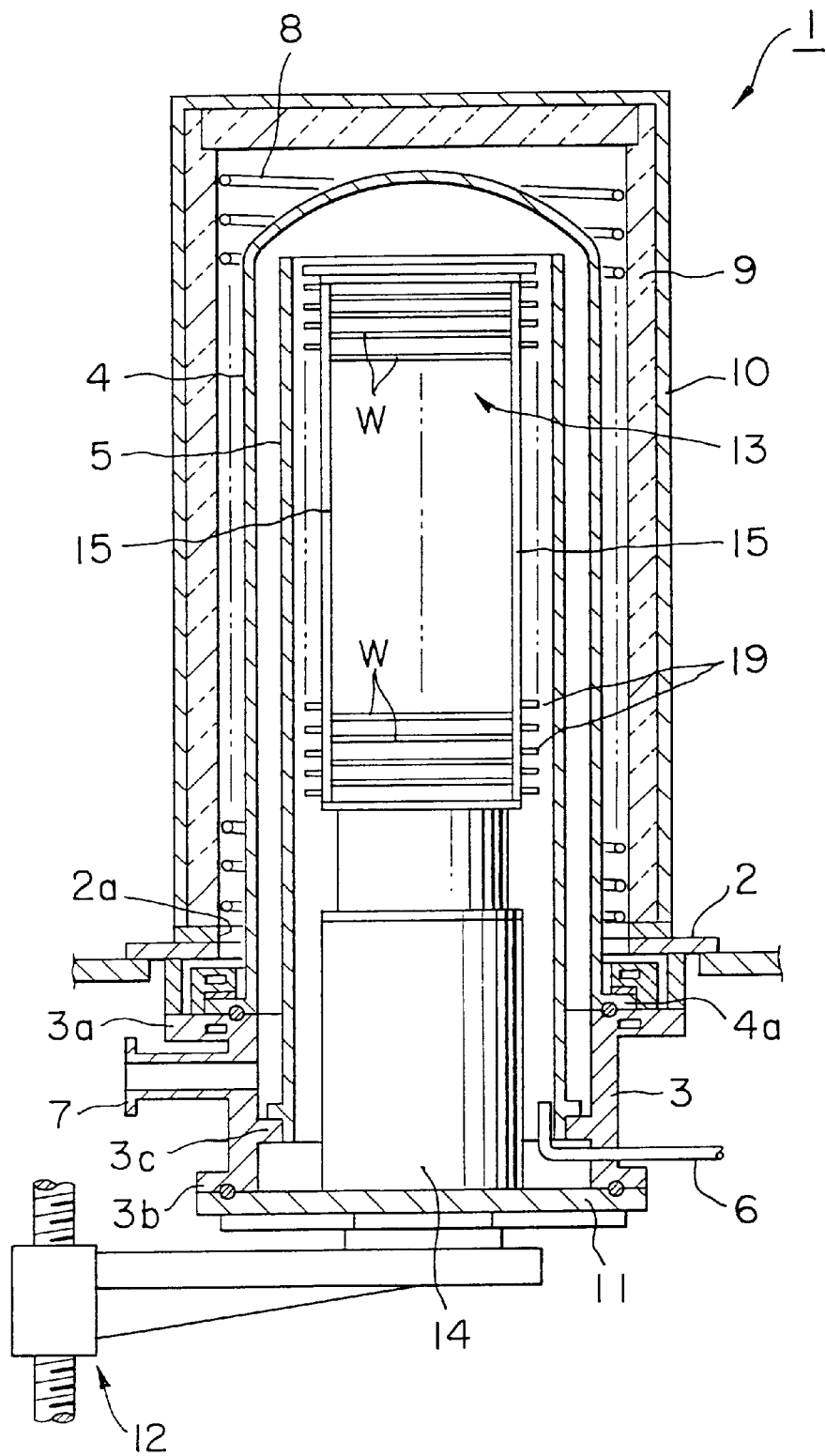
FIG. 1 is a vertical sectional view of the entire structure of a first embodiment of a thermal treatment apparatus of this invention.

A first embodiment of a thermal treatment apparatus in accordance with this invention, when applied to a vertical thermal treatment apparatus, will be described below with reference to the accompanying drawings. In FIG. 1, reference number 1 denotes a vertical thermal treatment apparatus that is configured to perform a film-formation process by reduced-pressure CVD on a substrate to be processed, such as a semiconductor wafer W. A base plate 2 made of a material such as stainless steel and having a circular aperture portion 2a at the center thereof is provided horizontally. A short cylindrical manifold 3 made of a material such as stainless steel and having radially outwardly extending upper and lower flanges 3a and 3b is disposed below the base plate 2, concentric with the circular aperture portion 2a. A reaction tube 4 is a thermal treatment vessel made of a material that is heat resistant and corrosion resistant, such as non-transparent quartz, in the form of a vertical thermal treatment furnace (thermal treatment chamber). The reaction tube 4 is connected hermetically above the manifold 3.

The upper end of the reaction tube 4 is closed and the lower end thereof is open and also has a outwardly extending flange 4a. A cylindrical inner tube 5 of quartz that has open upper and lower ends is disposed concentrically on the inner side of the reaction tube 4, resting on an inwardly extending flange 3c formed on an inner surface of the manifold 3, so that this structure forms a vertical thermal treatment furnace of a double-tube configuration.

A plurality of inlet pipes 6 are provided in the manifold 3 for introducing processing gases or inert gases into the inner tube from processing gas supply sources or inert gas supply sources that are not shown in the figure. Similarly, an exhaust pipe portion 7 is provided in the manifold 3 for removing gases from the interior of the reaction tube 4 by a pressure reduction means such as a vacuum pump (not shown in the figure), thus evacuating it to a degree of vacuum of, for example, between 10 to 10–8 Torr. A heater 8, which is a heat source formed of, for example, heating wires (resistance heater) of a material such as Kanthal, is disposed around the reaction tube 4 to heat the interior of the reaction tube 4 to a high temperature of, for example, approximately 700 to 1200° C. The outer periphery of this heater 8 is covered by an outer shell 10 formed of a material such as stainless steel in a cooling-jacket structure with a thermal insulating material 9 therebetween. This configures a batch-processing type of heating furnace. Note that the heater 8, the thermal insulating material 9, and the outer shell 10 are all supported on the base plate 2. A lid body 11 formed of a material such as stainless steel and which can be raised and lowered by an elevator mechanism 12, which is a loading mechanism, is provided below the manifold 3 to open and close the open end thereof. A wafer boat (ladder boat) 13 of non-transparent quartz acts as a substrate support means for holding and mounting a large number of wafers W, such as 150 wafers, horizontally in multiple stages at a suitable vertical spacing, and is mounted on the lid body 11 with a quartz heat-insulating tube 14 therebetween. A rotational drive means (not shown in the figure), for rotating the wafer boat 13 on the heat-insulating tube 14 so that the wafers W are heated uniformly, could also be provided on this lid body 11.

Figure 2:
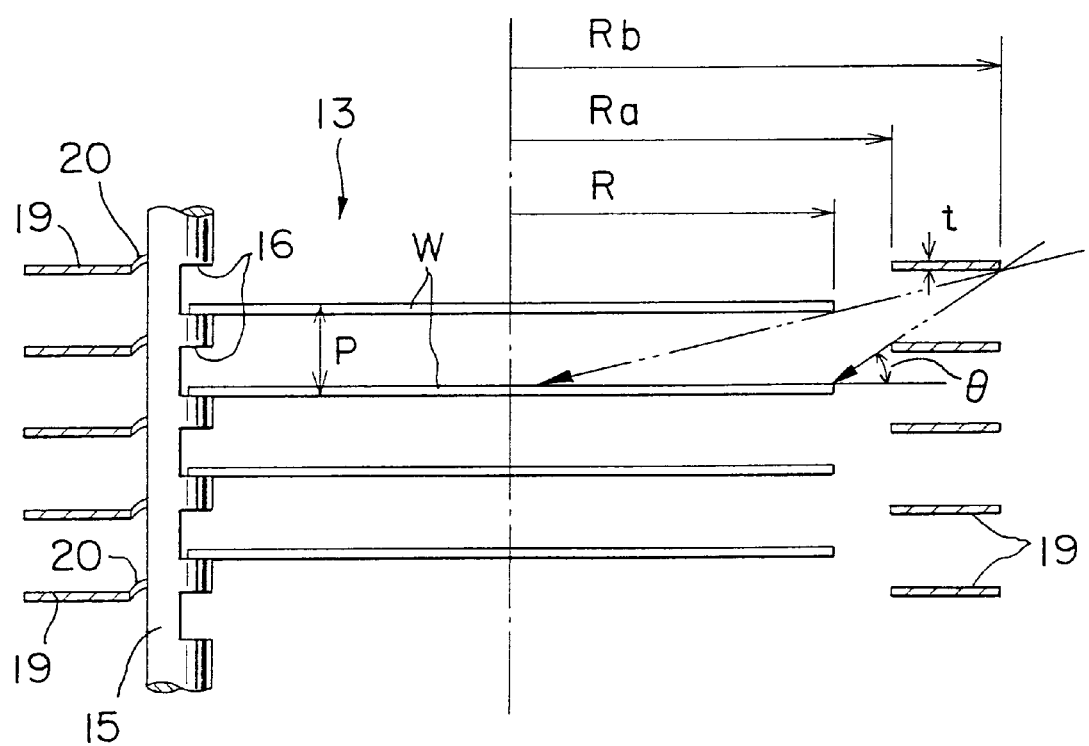
FIG. 2 is a partial vertical section showing a state in which thermal radiation is incident from a heater on loaded portions of substrates to be processed in a thermal treatment apparatus in accordance with a first embodiment of this invention.
Figure 3:
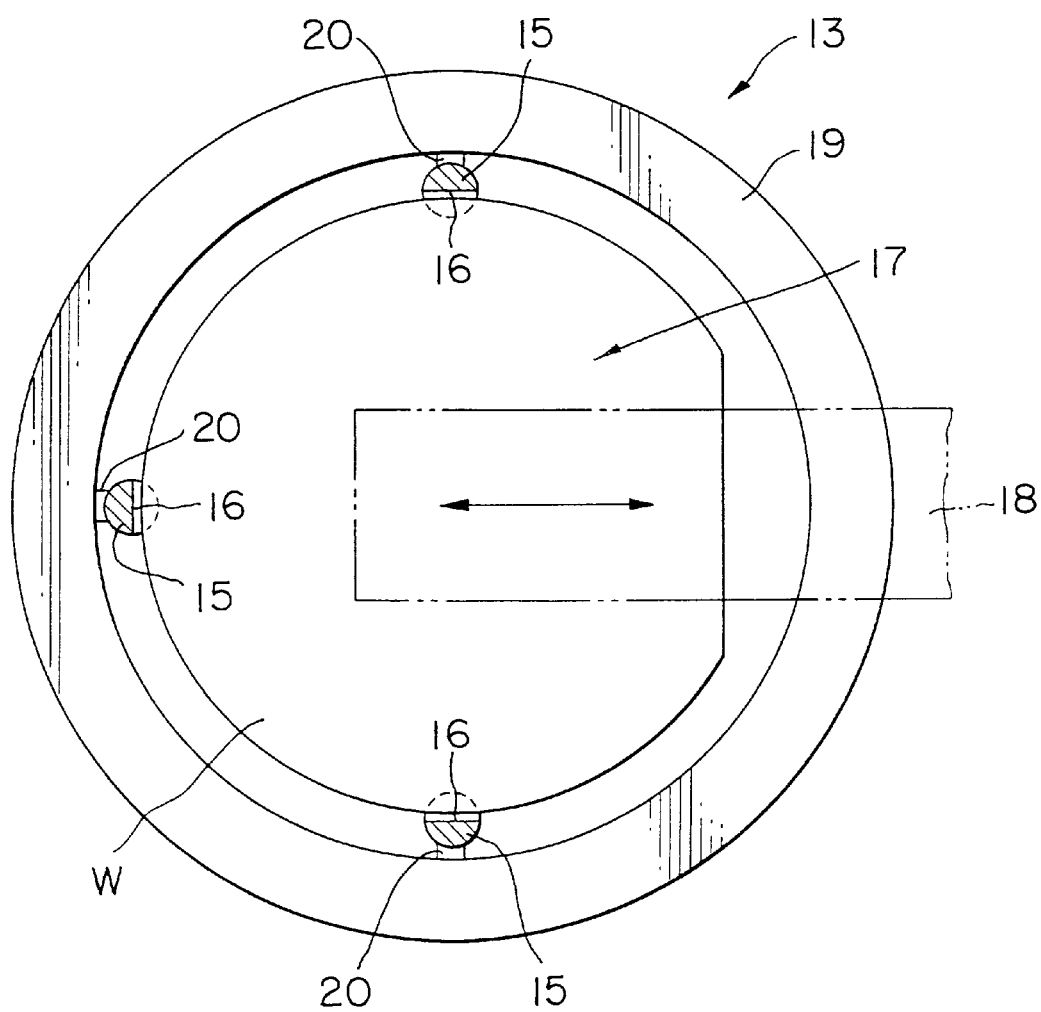
FIG. 3 is a plan view of the loaded portions of the substrates to be processed of FIG. 2.

The wafer boat 13 has a plurality (three or four, but three are shown in this embodiment) of support pillars 15 disposed at a suitable spacing around the periphery of the disc-shaped wafers W, as shown in FIGS. 1 to 3, and groove-shaped rest portions 16 are provided on these support pillars 15 for supporting a large number of wafers W, such as 150 wafers, in a horizontal state and in multiple stages at a suitable or predetermined vertical spacing. The support pillars 15 are configured so that an opening portion 17 is formed on one side, through which wafers W can be moved from the horizontal direction by a transfer mechanism (a transfer robot). Note that this transfer mechanism has a tongue-shaped transfer arm 18, as shown in FIG. 3, and the configuration is such that the tasks of moving a wafer W that is placed on this transfer arm 18 to and from the wafer boat 13, etc., are performed in a movement area disposed below the reaction tube 4.

This first embodiment of the thermal treatment apparatus of this invention is particularly characterized in having annular insulating members (buffers) 19, which intercept thermal radiation from the heater that is incident on the peripheral edge portions of the wafers W at a predetermined angle of incidence θ or greater, disposed on the support pillars 15 of the wafer boat 13 so as to be positioned around the wafers W at the same spacing (pitch) as that of the wafers W, in a multi-level Venetian-blind form with each individual wafer W being positioned between thermal protection members 19 that are vertically adjacent, as shown in FIGS. 2 and 3. The thermal protection members 19 have heat-resisting and heat-insulating properties and are made of a material that is not likely to form a source of contamination of the wafers, such as non-transparent quartz. Furthermore, the thermal protection members 19 are formed to a flat annular shape of a size such that they fit loosely on the outer side of the support pillars of the wafer boat 13, and the inner edge portion of each member is fixed by welds 20 at several locations to the outer side of the support pillars 15 of the wafer boat 13 (see FIGS. 2 and 3).

If it is assumed in this case that the radius of the wafers W is R, the radius of the inner edge portions (inner radius) of the thermal protection members 19 is Ra, and the radius of the outer edge portions (outer radius) thereof is Rb, as shown in FIG. 2, the size of the thermal protection members 19 is determined as described below. In general, the amount Q (in kcal/h) of heat transferred by radiation between two fixed surfaces at different temperatures is expressed by: $Q=F(T1^4-T2^4)A$. In this case, F is a radiation view factor, which is a non-dimensional factor that is zero at an angle of incidence of zero with respect to the incident surface, increases as the angle of incidence increases, and is a maximum at an angle of incidence of 90 degrees. If the area of the two fixed surfaces is extremely large and the distance between them is extremely small, the maximum value thereof is 1. In other words, this is a state in which no radiation leaks out from between the two plates. T1 is the temperature of the heater 8, T2 is the temperature of the wafer W, and A is another constant.

Figure 4:
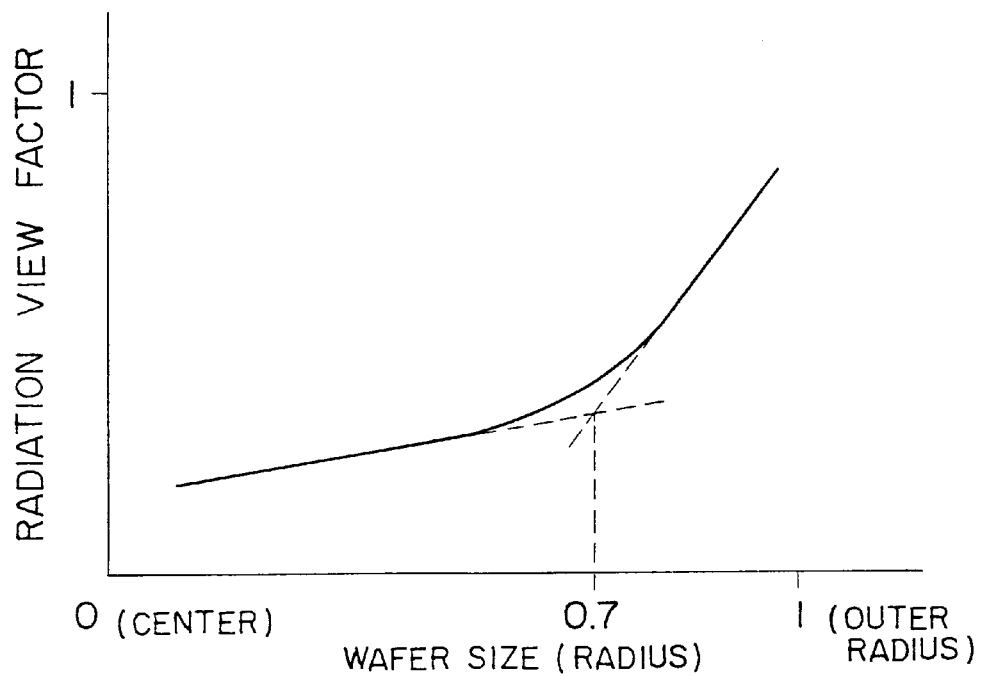
FIG. 4 is a graph of the relationship between wafer size and radiation view factor.

If the radius R of the wafers W is taken to be 1, the radiation view factor F with respect to the entire heat source body, as seen from points within the surface of one of the wafers W disposed in a multistage manner in the vertical direction at a predetermined pitch, rises abruptly from a point at approximately 0.7 to the edge portion of the wafer (the 1 point), as shown in FIG. 4. In that case, if the radius R of the wafers W shown in FIG. 2 is taken to be 0.7 and the radius Rb of the outer edge portion of the thermal protection members 19 is taken to be 1, the radiation view factor F within the surface of each wafer can be reduced. Therefore, if the radius R of the wafers W is taken to be 1, it is optimal for the radius of the outer edge portions of the thermal protection members 19 to be 1.4, in other words, 1.4 times the radius R of the wafers W. Note that the radius Rb of the outer edge portions of the thermal protection members 19 can be varied within a permissible range to a certain degree, due to the thermal-shielding effect thereof, so it is preferably within 1.2 to 1.8 times the radius R of the wafers W. This is to prevent sudden changes in the temperature, because the thermal-shielding effect decreases when this ratio is less than 1.2 and increases when it exceeds 1.8.

Provided that the radius Ra of the inner edge portions of the thermal protection members 19 is substantially equal to the radius R of the wafers W (in other words, if they are in close proximity), it could be slightly smaller than the radius R of the wafers W or even slightly greater than the radius R of the wafers W, as in this first embodiment (see FIG. 2). Furthermore, the thickness or the like of each of the thermal protection members 19 could be varied to ensure that they have the same thermal capacity as the wafers W. The inner radius (inner edge portion), outer radius (outer edge portion), and thickness of the thermal protection members 19 are set specifically by experimentation, from consideration of the above described value (ratio) and also to values that ensure that the difference in temperature within the surface between the central portion and peripheral edge portion of each wafer W is as small as possible.

The description now turns to the operation of this first embodiment. First of all, wafers W are transferred by the transfer arm 18 (see FIG. 3) of the movement mechanism into the wafer boat 13 disposed on the lid body 11, which has been moved downward into the movement area below the reaction tube 4 by the elevator mechanism 12 of FIG. 1, the lid body 11 is raised by the elevator mechanism 12, then the wafer boat 13 is inserted into the reaction tube 4. Subsequently, the lid body 11 is brought into hermetic contact with the lower edge flange portion 3b of the manifold 3 to seal the interior of the reaction tube 4.

After the interior of the reaction tube 4 has been brought to a vacuum by exhausting (vacuum extraction) from the exhaust pipe portion 7, an inert gas such as nitrogen ($N_2$) is introduced from the inlet pipes 6 to fill the interior of the reaction tube 4 with the nitrogen ($N_2$). The introduction of inert gas is then halted, the interior of the reaction tube 4 is maintained at a predetermined low-pressure state while a predetermined processing gas is introduced through the inlet pipes 6 and the wafers W are heated rapidly by the heater 8 to a predetermined processing temperature, then a thermal treatment such as film-formation processing is performed on the wafers W. After this thermal treatment has ended, the temperature of the thermally-treated wafers W is suddenly reduced to, for example, room temperature and the treated wafers W are transported out of the reaction tube 4 together with the wafer boat 13 by the lowering of the lid body 11.

In the thus configured thermal treatment apparatus of this first embodiment of the invention, the temperature of the wafers W is raised or lowered rapidly within the thermal treatment chamber that is under a reduced pressure. In accordance with the thermal treatment apparatus of this invention, thermal radiation that is incident on peripheral edge portions of the wafers W at a predetermined angle of incidence θ or greater is intercepted by the thermal protection members 19 provided around the wafers W, so that the effects of thermal radiation on the peripheral edge portions of the wafers W are controlled (see FIG. 2). In other words, the effects of thermal radiation on the peripheral edge portions of the wafers W that are attributable to the batch-processing type of heating are controlled by the Venetian-blind action of the thermal protection members 19 and the mitigating action due to the thermal capacity thereof, so that the temperature response characteristics of the peripheral edge portions of the wafers W can be made substantially equal to the temperature response characteristics of the central portions thereof. In addition, the temperature difference within the surface between the central portion and peripheral edge portion of each wafer W during rapid changes in temperature can be reduced, which is intended to make the temperature within the surface of the wafer W uniform.

Therefore, the effects of thermal radiation on the peripheral edge portions of the wafers W are controlled in the vertical thermal treatment apparatus of the first embodiment of the invention, not only from the viewpoint of heat conduction through gases but also from heat transfer by radiation, unlike in the thermal treatment apparatus of the prior art, thus making it possible to sufficiently reduce the difference in temperature within the surface between the central portion and peripheral edge portion of each wafer W, not only under normal pressure within a thermal treatment chamber but also under reduced pressures, so that the temperature can be raised or lowered rapidly, enabling an increase in throughput. In the above-described first embodiment, the wafers W are supported in a horizontal state and in multiple stages at a suitable spacing in the wafer boat 13 which has a plurality of support pillars 15 (for example, three) disposed around the wafers W. In particular, since the annular thermal protection members 19 are disposed on the support pillars 15 of the wafer boat 13 at substantially the same spacing and in a multistage manner, the difference in temperature within the surface between the central portion and peripheral edge portion of each wafer W can be actively reduced, not only under normal pressure but also under reduced pressures, so that the temperature can be raised or lowered rapidly, enabling a further increase in throughput. Furthermore, the wafers W in the vertical thermal treatment apparatus of the first embodiment of this invention are disposed so as to be positioned between thermal protection members 19 that are vertically adjacent, so that the transfer arm 18 of the transfer mechanism (see FIG. 3) does not interfere with the thermal protection members 19 when the wafers W are being moved in the horizontal direction, and thus the transfer of the wafers W can be performed easily and rapidly through the opening portion 17 between the support pillars 15, enabling a yet further increase in throughput. In addition, the thermal protection members 19 have a thermal capacity that is greater than that of the wafers W, so that dramatic increases and decreases in the temperature of the peripheral edge portions of the wafers W can be relieved, not only because of the thermal-shielding effect due to the Venetian-blind action thereof but also by the thermal capacity of the thermal protection members 19. As a result, the temperature difference within the surface between the central portion and peripheral edge portion of each substrate to be processed can be sufficiently reduced, not only under normal pressure within the thermal treatment chamber but also under reduced pressures, and thus the temperature can be raised or lowered even more rapidly, enabling an even further increase in throughput.

The results described below were obtained from rapid temperature-change tests (simulations) performed using the wafer boat 13 of the above-described first embodiment and an existing ring boat. First of all, the inner radius of the support plates of the ring boat was assumed to be 140 mm, with an outer radius of 200 mm and a thickness of 5 mm, whereas the inner radius (Ra) of the thermal protection members 19 of the wafer boat 13 of the first embodiment of this invention was assumed to be 210 mm, with an outer radius (Rb) of 280 mm and a thickness (t) of 5 mm. Wafers W of an eight-inch size were used, and the wafer pitch (P) was 20 mm (see FIG. 2).

A rapid increase in temperature was performed (at, for example, 50° C./minute on average) to raise the temperature of the wafers W from room temperature of 25° C. to 800° C., and a rapid decrease in temperature was performed (at, for example, 50° C./minute on average) to reduce the temperature from 800° C. to 25° C. As a result, a maximum temperature difference of 50° C. was observed between the central portions and peripheral edge portions of the surfaces of the wafers W when the existing ring boat was used, whereas the maximum temperature difference between the central portions and peripheral edge portions of the surfaces of the wafers W when the wafer boat 13 of the first embodiment of this embodiment was 35° C. This proves sufficiently that the present invention reduces the temperature difference within the surface of each wafer W.

Embodiment 2

Figure 5:
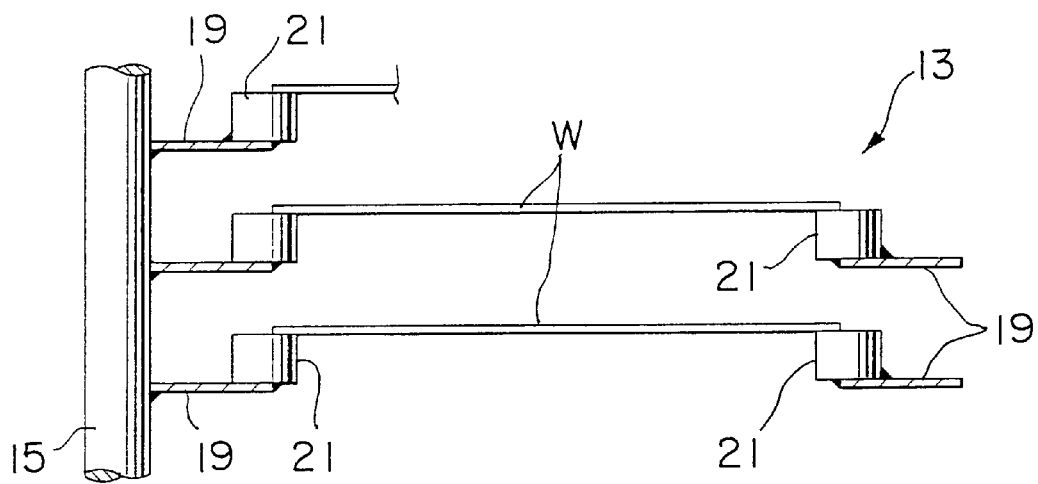
FIG. 5 is a partial vertical section of loaded portions of substrates to be processed in a thermal treatment apparatus in accordance with a second embodiment of this invention.

A second embodiment of the thermal treatment apparatus of this invention is shown in FIGS. 5 and 6. Components that are the same as those of Embodiment 1 are given the same reference numbers and further description thereof is omitted. As shown in these figures, a wafer boat 13 of this second embodiment has a plurality of support pillars 15 (three or four), such as three, disposed at a suitable spacing around the periphery of flat, annular thermal protection members 19. The annular thermal protection members 19 are fixed to the inner sides of these support pillars 15 in multiple stages at a suitable spacing in the vertical direction by welding or the like on outer edge portions thereof. Support portions 21 for supporting the wafers W between adjoining thermal protection members 19 are provided at a suitable spacing in the peripheral direction (at, for example, three equidistant locations) on upper surfaces of the inner edge portions of the thermal protection members 19 disposed in multiple stages. In addition to achieving effects similar to those of the first embodiment described above, this second embodiment makes it possible to actively reduce the effects of the support pillars 15 on the uniformity of the temperature within the surfaces of the wafers W, because the support pillars 15 of the wafer boat 13 are separated from the peripheral edge portions of the wafers W.

INDUSTRIAL APPLICABILITY

As described above, the thermal treatment apparatus of this invention is suitable as a batch-type of vertical thermal treatment apparatus for subjecting a large number of wafers to a thermal treatment, and also in a hot-wall type of single-wafer thermal treatment apparatus. In addition to semiconductor wafers, the substrates to be processed could be any other suitable substrates such as LCD substrates. In addition to non-transparent quartz, the thermal protection members could be of any suitable material such as silicon carbide (SiC).

I claim:

1. A thermal treatment apparatus for accommodating substrates to be processed within a thermal treatment chamber and performing a thermal treatment thereon, comprising:

substrate support means for supporting a plurality of substrates in a vertically spaced parallel arrangement; and thermal protection members disposed in a vertically spaced arrangement and at positions which are spaced vertically apart from neighboring substrates supported on the substrate support means and around the neighboring substrates with each of the thermal protection members being vertically separated from and between an immediately upper and lower set of substrates for intercepting thermal radiation that would otherwise be incident on a peripheral edge portion of each of the substrates at a predetermined angle of incidence or greater.

2. The thermal treatment apparatus as defined in claim 1, wherein said thermal protection members have a thermal capacity greater than that of the substrates to be processed.

3. The thermal treatment apparatus as defined in claim 1, wherein said thermal protection members are formed of non-transparent quartz.

4. The thermal treatment apparatus as defined in claim 1, wherein said thermal protection members are formed of silicon carbide.

5. The thermal treatment apparatus as defined in claim 1, wherein said thermal treatment apparatus is a vertical batch-processing type of thermal treatment apparatus.

6. The thermal treatment apparatus as defined in claim 1, wherein said thermal treatment apparatus is a hot-wall type of single-wafer thermal treatment apparatus.

7. The thermal treatment apparatus as defined in claim 1, wherein said substrates to be processed are semiconductor wafers.

8. The thermal treatment apparatus as defined in claim 1, wherein said substrates to be processed are LCD substrates.

9. The thermal treatment apparatus as defined in claim 1, wherein each of said thermal protection members is formed of an annular plate having an outer edge portion of a radius that is between 1.2 and 1.8 times the radius of each substrate to be processed.

10. The thermal treatment apparatus as defined in claim 1, wherein said substrate support means has support pillars having means for mounting the substrates thereon, and said thermal protection members are fixed to said support pillars.

11. A thermal treatment apparatus as recited in claim 1, wherein said thermal protection members are annular members having an inner edge which is equal to or greater in radius than an outer edge radius of substrates supported by said substrate support.

12. A thermal treatment apparatus as recited in claim 11, wherein said inner edge of said thermal protection members is greater in radius than the outer edge radius of the supported substrates.

13. A thermal treatment apparatus as recited in claim 1, wherein said thermal protection members are permanently fixed to said substrate support.

14. A thermal treatment apparatus for accommodating substrates to be processed within a thermal treatment chamber and performing a thermal treatment thereon, comprising:

substrate support means for supporting a plurality of substrates in a vertically spaced parallel arrangement; and thermal protection members disposed in a vertically spaced arrangement and at positions which are spaced vertically apart from neighboring substrates supported on the substrate support means and around the neighboring substrates for intercepting thermal radiation that would otherwise be incident on a peripheral edge portion of each of the substrates at a predetermined angle of incidence or greater, wherein said substrate support means has support pillars having means for mounting the substrates thereon, and said thermal protection members are fixed to said support pillars, and wherein said means for mounting the substrates are provided on an inner side of each of the support pillars, and the thermal protection members are fixed on an outer side of each of the support pillars.

15. The thermal treatment apparatus as defined in claim 14, wherein said means for mounting the substrates are substrate rest portions in the form of grooves cut in each of the pillars.

16. A thermal treatment apparatus for accommodating substrates to be processed within a thermal treatment chamber and performing a thermal treatment thereon, comprising:

substrate support means for supporting a plurality of substrates in a vertically spaced parallel arrangement; and thermal protection members disposed in a vertically spaced arrangement and at positions which are spaced vertically apart from neighboring substrates supported on the substrate support means and around the neighboring substrates for intercepting thermal radiation that would otherwise be incident on a peripheral edge portion of each of the substrates at a predetermined angle of incidence or greater, wherein said substrate support means has support pillars having means for mounting the substrates thereon, and said thermal protection members are fixed to said support pillars, and wherein said thermal protection members are fixed on an inner side of each of the support pillars, and said means for mounting the substrates are provided on the thermal protection members, respectively, to mount each of the substrates in an upwardly spaced relation to each of the thermal protection.

17. A substrate supporting device for use in a thermal treatment chamber of a thermal treatment apparatus for processing substrates, comprising:

substrate support means for supporting a plurality of substrates in a vertically spaced parallel arrangement; and thermal protection members disposed in a vertically spaced arrangement around neighboring substrates supported on the substrate support means, said thermal protection members being spaced vertically apart from the neighboring substrates in such a manner that each of the thermal protection members is vertically separated from and between an immediately upper and lower set of substrates, for intercepting thermal radiation that is incident on peripheral edge portions of the substrates at a predetermined angle of incidence or greater.

18. The substrate supporting device as defined in claim 17, wherein said thermal protection members have a thermal capacity greater than that of the substrates to be processed.

19. The substrate supporting device as defined in claim 17, wherein said thermal protection members are formed of non-transparent quartz.

20. The substrate supporting device as defined in claim 17, wherein said thermal protection members are formed of silicon carbide.

21. The substrate supporting device as defined in claim 17, wherein each of said thermal protection members is formed of an annular plate having an outer edge portion of a radius that is between 1.2 and 1.8 times the radius of each substrate to be processed.

22. A substrate supporting device for use in a thermal treatment chamber of a thermal treatment apparatus for processing substrates, comprising:

substrate support means for supporting a plurality of substrates in a vertically spaced parallel arrangement; and thermal protection members disposed in a vertically spaced arrangement around neighboring substrates supported on the substrate support means, said thermal protection members being spaced vertically apart from the neighboring substrates, for intercepting thermal radiation that is incident on peripheral edge portions of the substrates at a predetermined angle of incidence or greater, and wherein said substrate support means has support pillars having means for mounting the substrates thereon, and said thermal protection members are fixed to said support pillars.

23. The substrate supporting device as defined in claim 22, wherein said means for mounting the substrates are provided on an inner side of each of the support pillars, and the thermal protection members are fixed on an outer side of each of the support pillars.

24. The substrate supporting device as defined in claim 23, wherein said means for mounting the substrates are substrate rest portions in the form of grooves cut in each of the pillars.

25. The substrate supporting device as defined in claim 22, wherein said thermal protection members are fixed on an inner side of each of the support pillars, and said means for mounting the substrates are provided on the thermal protection members, respectively, to mount each of the substrates in an upwardly spaced relation to each of the thermal protection members.

26. A thermal treatment apparatus for accommodating substrates to be processed within a thermal treatment chamber, comprising:

a substrate support having a plurality of substrate support spacers which contact the substrates and are positioned to place the substrates in a vertically spaced parallel arrangement;

a plurality of thermal radiation buffers that are disposed in a vertically spaced arrangement so as to be vertically separated and between an immediate upper and lower set of substrates supported by said spacers, and said thermal radiation buffers being dimensioned and arranged so as to extend about an adjoining substrate for intercepting thermal radiation that would otherwise be incident on a peripheral position of each of the substrates at a predetermined angle of incidence or greater.

27. A thermal treatment apparatus as recited in claim 26, wherein said thermal radiation buffers are annular insulating members that have an inner edge radius equal to or greater than an outer edge radius of the substrates supported by said substrate support.

28. A thermal treatment apparatus as recited in claim 27, wherein said thermal radiation buffers have an inner edge radius which is greater than the outer edge radius of the substrates supported by said substrate support.

29. A thermal treatment apparatus as recited in claim 27, wherein said substrate support comprises a plurality of support pillars which have said substrate support spacers positioned on an inner side of said pillars and said thermal radiation buffers are fixed to an outer side of said pillars.

30. A thermal treatment apparatus as recited in claim 27, wherein said substrate support includes a plurality of pillars and said thermal buffers each have an outer edge fixed to an inner side of said pillars.

31. A thermal treatment apparatus as recited in claim 30, wherein said substrate support spacers include support portions (21) which support portions (21) are fixed to said thermal radiation buffers and have an inner side further inward than the inner edge of said thermal radiation buffers.

32. A thermal treatment apparatus as recited in claim 26, wherein said thermal radiation buffers are permanently affixed to said substrate support.

33. A thermal treatment apparatus as recited in claim 26, wherein said thermal buffers have the same vertical spacing or pitch as that of the substrates and a horizontal level of said thermal buffers between supported substrates is closer to an upper one of said upper and lower set of substrates supported by said spacers than a lower one of said upper and lower set of substrates supported by said spacers. members.

* * * * *